(12) United States Patent
He et al.

(10) Patent No.: US 11,218,112 B2
(45) Date of Patent: Jan. 4, 2022

(54) SILICON PHOTOVOLTAIC CELL SCANNING EDDY CURRENT THERMOGRAPHY DETECTION PLATFORM AND DEFECT CLASSIFICATION METHOD

(71) Applicant: WUHAN UNIVERSITY, Hubei (CN)

(72) Inventors: Yigang He, Hubei (CN); Bolun Du, Hubei (CN); Yaru Zhang, Hubei (CN); Jiajun Duan, Hubei (CN); Liulu He, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 175 days.

(21) Appl. No.: 16/593,957

(22) Filed: Oct. 4, 2019

(65) Prior Publication Data
US 2020/0313612 A1    Oct. 1, 2020

(30) Foreign Application Priority Data
Mar. 26, 2019  (CN) .......................... 201910233644.8

(51) Int. Cl.
*H02S 50/15*       (2014.01)
*G06N 3/02*        (2006.01)
*H01L 21/66*       (2006.01)

(52) U.S. Cl.
CPC .............. *H02S 50/15* (2014.12); *G06N 3/02* (2013.01); *H01L 22/24* (2013.01)

(58) Field of Classification Search
CPC ............ H02S 50/15; G06N 3/02; H01L 22/24
See application file for complete search history.

(56) References Cited

U.S. PATENT DOCUMENTS 5,444,241 A * 8/1995 Del Grande ........... G01N 25/72
250/253
10,242,439 B1 * 3/2019 Koshti .................... G06T 7/11
(Continued)

FOREIGN PATENT DOCUMENTS

CN       202068606 U  * 12/2011
CN       203292095 U  * 11/2013
(Continued)

OTHER PUBLICATIONS

CN-202068606-U, Espacenet English Translation, downloaded from the Internet May 10, 2021 (Year: 2011).*
(Continued)

*Primary Examiner* — Alexander Satanovsky
*Assistant Examiner* — Lyudmila Zaykova-Feldman
(74) *Attorney, Agent, or Firm* — JCIPRNET

(57) ABSTRACT

The disclosure provides a silicon photovoltaic cell scanning eddy current thermography detection platform and a defect classification method. The technical solution adopted by the disclosure is: firstly, fixing the position of the electromagnetic inductive coil and the thermal imager, and using the main conveyor belt to carry the silicon photovoltaic cell to move forward on the production line to form a scanning eddy current heating of the silicon photovoltaic cell. Secondly, the defect temperature information is obtained through the thermal imager in terms of thermal image sequences. Thirdly, the feature extraction algorithms are used to extract the silicon photovoltaic cell defect features. Finally, the image classification algorithms are used to classify the silicon photovoltaic cell defects, and the sorting conveyor belts are used to realize the automatic sorting of silicon photovoltaic cells with different types of defects on the production line.

8 Claims, 8 Drawing Sheets

(56) References Cited

U.S. PATENT DOCUMENTS

| | | | |
|---|---|---|---|
| 2002/0126732 A1* | 9/2002 | Shakouri | G01J 5/08 374/130 |
| 2006/0103371 A1* | 5/2006 | Manz | H02S 50/10 324/757.01 |
| 2008/0012499 A1* | 1/2008 | Ragay | H05B 3/0076 315/113 |
| 2008/0089773 A1* | 4/2008 | Mulligan | H01L 21/67739 414/804 |
| 2009/0238444 A1* | 9/2009 | Su | G01M 11/00 382/149 |
| 2012/0187105 A1* | 7/2012 | Parks | F27B 9/243 219/388 |
| 2019/0249923 A1* | 8/2019 | Ruf | H01L 31/022425 |

FOREIGN PATENT DOCUMENTS

| | | | |
|---|---|---|---|
| CN | 107192759 A | * | 9/2017 |
| CN | 109145973 A | * | 1/2019 |

OTHER PUBLICATIONS

CN-203292095-U, Espacenet English translation, downloaded from the Internet Apr. 28, 2021 (Year: 2013).*
FLIR A310 Specification, downloaded from the I nternet on May 22, 2021 (Year: 2014).*
CN-107192759-A, Espacenet English Translation, downloaded from the Internet May 3, 2021 (Year: 2017).*
CN-109145973-A, Espacenet English Translation, downloaded from the Internet May 10, 2021 (Year: 2019).*

* cited by examiner

Independent component analysis

Non-negative matrix factorization

SILICON PHOTOVOLTAIC CELL SCANNING EDDY CURRENT THERMOGRAPHY DETECTION PLATFORM AND DEFECT CLASSIFICATION METHOD

CROSS-REFERENCE TO RELATED APPLICATION

This application claims the priority benefit of China application serial no. 201910233644.8, filed on Mar. 26, 2019. The entirety of the above-mentioned patent application is hereby incorporated by reference herein and made a part of this specification.

BACKGROUND

Technical Field

The disclosure relates to the technical field of silicon photovoltaic cell defect detection, in particular to a silicon photovoltaic cell scanning eddy current thermography defect detection platform and defect classification method.

Description of Related Art

The quality of silicon photovoltaic cells directly affects the efficiency of the entire system. In the industrial manufacture and operation process of silicon photovoltaic cells, defects and damages are inevitable. For example, cracks and scratches in silicon photovoltaic cells can gradually reduce the output power of photovoltaic component and even cause hot spots until the photovoltaic component is destroyed. Therefore, it is meaningful to establish a non-destructive, fast and accurate silicon photovoltaic cell defect detection and defect classification method. With the rapid development of infrared thermography, machine vision detection and convolutional neural network algorithms, the requirements for high resolution, non-contact, quantitative analysis and defect classification of silicon photovoltaic cells can be met.

The existing eddy current thermography defect detection methods have the following shortcomings: 1) static detection with low speed; 2) uneven heating, poor defect detection effect; 3) small detection number. Moreover, the existing industrial manufacturing line manual detection method has the disadvantage of low defect detection efficiency and high detection error rate.

SUMMARY

In view of the shortcomings of low manual detection efficiency, small detection number and high detection error rate in existing silicon photovoltaic cell defects detection method, the present disclosure establishes a dynamic scanning eddy current thermography defect detection method and provides an efficient and innovative silicon photovoltaic cell defect intelligent classification method. The purpose of the disclosure is to improve the accuracy of silicon photovoltaic cell detection, ensure the safety and reliability of silicon photovoltaic cell manufacturing process, and realize large-scale silicon photovoltaic cell defect classification.

The technical solution adopted by the present disclosure to solve the technical problem thereof is:
providing a silicon photovoltaic cell scanning eddy current thermography detection platform, comprising:
a main displacement platform on which a main conveyor belt is disposed, and a silicon photovoltaic cell is placed on the main conveyor belt;
a thermal imager, acquiring a thermal image sequence of silicon photovoltaic cells in real time;
a plurality of sorting displacement platforms connected to the main displacement platform, wherein the sorting conveyor belts are placed thereon, and the silicon photovoltaic cells with different defects on the main conveyor belt are sorted through different sorting conveyor belts;
an inductive sensing heating module that inductively heats a silicon photovoltaic cell through electromagnetic induction;
a thermal imager disposed above the silicon photovoltaic cell on the main displacement platform to capture surface thermal radiation information of the plurality of silicon photovoltaic cells in real time;
a computer connected with the thermal imager to obtain the raw data and perform thermal sequence analysis, extracting defect features, and use convolutional neural network algorithms to classify different types of silicon photovoltaic cell defects; controlling the sorting displacement platform, sorting the silicon photovoltaic cells with different defects through different sorting conveyor belts.

In continuation of the above technical solution, the inductive heating module includes a function signal generator, an inductive heating power supply, an electromagnetic inductive coil and a water-cooling system. The function signal generator controls the heating mode, the output power and the electromagnetic inductive frequency of the inductive heating power supply; and the electromagnetic inductive coil is arranged above the silicon photovoltaic cell on the main displacement platform.

In continuation of the above technical solution, the electromagnetic inductive coil is disposed at a height of 5 cm above the silicon photovoltaic cell on the main displacement platform. The electromagnetic inductive coil is an inner hollow flat rectangular structure and an elongated structure.

In continuation of the above technical solution, the water-cooling system introduces water into the hollow electromagnetic inductive coil to reduce the temperature of the electromagnetic inductive coil. The cooling water pressure is 0.2~0.3 MPa.

In continuation of the above technical solution, the thermal imager is disposed at a height of 60 cm above the silicon photovoltaic cell on the main displacement platform. The measurement accuracy of the thermal imager is ±2°. The detection temperature range is −20° C.~120° C. The spectral response range is 7.5 μm~13 μm.

In continuation of the above technical solution, the temperature sensitivity of the thermal imager is 50 mK.

In continuation of the above technical solution, the heating mode of the inductive heating module includes a pulse heating mode and a lock-in heating mode.

The disclosure further provides a silicon photovoltaic cell infrared vision defect detection method, wherein the method comprises the following steps.

S1, carry a normal silicon photovoltaic cell and a defective silicon photovoltaic cell through a main conveyor belt at a constant speed to pass the inductive heating module and a field of view of a thermal imager.

S2, inductively heat the silicon photovoltaic cell through the inductive heating module. In the process of scanning eddy current thermography, the thermal radiation information of the silicon photovoltaic cell includes a surface temperature value of the silicon photovoltaic cell.

S3, obtain a transient temperature response of the surface of the silicon photovoltaic cells at different positions through the thermal imager, and obtain thermal image sequences at different time points as the raw data. Each of the silicon photovoltaic cell receives multiple thermal image sequences.

S4, use frequency domain cross-correlation, principal component analysis, independent component analysis and non-negative matrix factorization feature extraction algorithms to extract defect features from the thermal image sequences at different time points.

S5, use convolutional neural networks to classify different types of silicon photovoltaic cell defects. The classified defects include edge fracture, surface impurities, scratches, cracks, hot spots and large area damage.

S6, sort silicon photovoltaic cells with different defects through different sorting conveyor belts.

In continuation of the above technical solution, step S1 further includes optimizing the setting according to the defect attributes of the silicon photovoltaic cells, including setting the moving speed of the main conveyor belt, a size of field of view of the thermal imager, parameters of the inductive heating module, parameters of the thermal imager, and data acquisition frequency.

The disclosure further provides a silicon photovoltaic cell infrared vision defect detection software system. The software system integrates the defect detection classification and sorting module, comprising the following.

A reference signal setting module is configured to set the reference signal, use the finite element model to generate the response signal of the defect-free area as the reference signal, or use a detection signal of the defect-free area of the silicon photovoltaic cell as the reference signal, or the average detection signal at certain points in the defect-free area in the detection data is used as a reference signal.

A detection signal extraction module is configured to use a transient temperature change sequence at a different position from the electromagnetic inductive coil of the silicon photovoltaic cell captured by the thermal imager in real time as a detection signal and use feature extraction algorithms to extract the defect features from the detection signal.

A defect classification module for classifying different types of silicon photovoltaic cell defects by using convolutional neural networks.

A defect sorting module, which controls the sorting conveyor belts to sort and recycle the silicon photovoltaic cells with different defects.

The disclosure has the advantageous effects that the disclosure uses the eddy current inductive coil to scan and heat the silicon photovoltaic cell, obtains the defect temperature information by using the thermal imager in a non-contact, fast and high-resolution manner, and adopts the feature extraction algorithms to extract defect features from the thermal image sequences at different time points, and use the convolutional neural networks to classify a large number of different types of silicon photovoltaic cell defects. In this manner, it is possible to realize automatic sorting of different defective silicon photovoltaic cells on the manufacturing line. The disclosure transforms the manual detection of silicon photovoltaic cell defects into infrared machine vision detection on the manufacturing line, thereby improving the detection speed and reduces the consumption of labor and material resources. In the meantime, the scanning eddy current thermography detection method solves the problem of slow static detection speed, improves the defect detection effect, solves the problem that the number of silicon photovoltaic cells can be detected is small, and reduces the sorting error rate.

BRIEF DESCRIPTION OF THE DRAWINGS

The present disclosure will be further described below with reference to the accompanying drawings and embodiments.

In FIG. 1: 1. inductive heating power supply, 2. thermal imager, 3. electromagnetic inductive coil, 4. thermal radiation information, 5. normal silicon photovoltaic cell, 6. defective silicon photovoltaic cell, 7. sorting conveyor belt, 8. main conveyor belt, 9. computer, 10. frequency domain cross-correlation, 11. principal component analysis, 11. independent component analysis, 12. non-negative matrix fraction, 13. GoogLeNet, 14. VGG-16, 15, LeNet-5, 16. sorting of silicon photovoltaic cell with different defects.

DESCRIPTION OF THE EMBODIMENTS

In order to make the purpose, technical solutions and advantages of the present disclosure more comprehensible, the present disclosure will be further described in detail below with reference to the accompanying drawings and embodiments. It is understood that the specific embodiments described herein are merely illustrative of the disclosure and are not intended to limit the disclosure.

The main principle of the disclosure is: the electromagnetic inductive coil and the thermal imager are fixed, and the main conveyor belt moves the silicon photovoltaic cell at a constant speed through the electromagnetic inductive coil and the field of view of the thermal imager. During the scanning process, the electromagnetic inductive coil performs uniform and finite length electromagnetic inductive heating on the silicon photovoltaic cell to be detected, and the thermal imager continuously collects the surface temperature values (thermal image sequence) at different positions of the same silicon photovoltaic cell under dynamic conditions as raw data. The scanning heating technology can simultaneously record temperature values at different conduction times, and one detection can reflect temperature information of different silicon photovoltaic cells. The feature extraction algorithms are used to process the raw data, and the defect features with specific depth attribute are extracted. Image classification algorithms are used to classify different types of silicon photovoltaic cell defects. The silicon photovoltaic cells with different defects are sorted and recycled through different sorting conveyor belts. Finally, the present disclosure provides a reliable method for in-service detection and defect sorting in the production of silicon photovoltaic cells.

Figure 1:
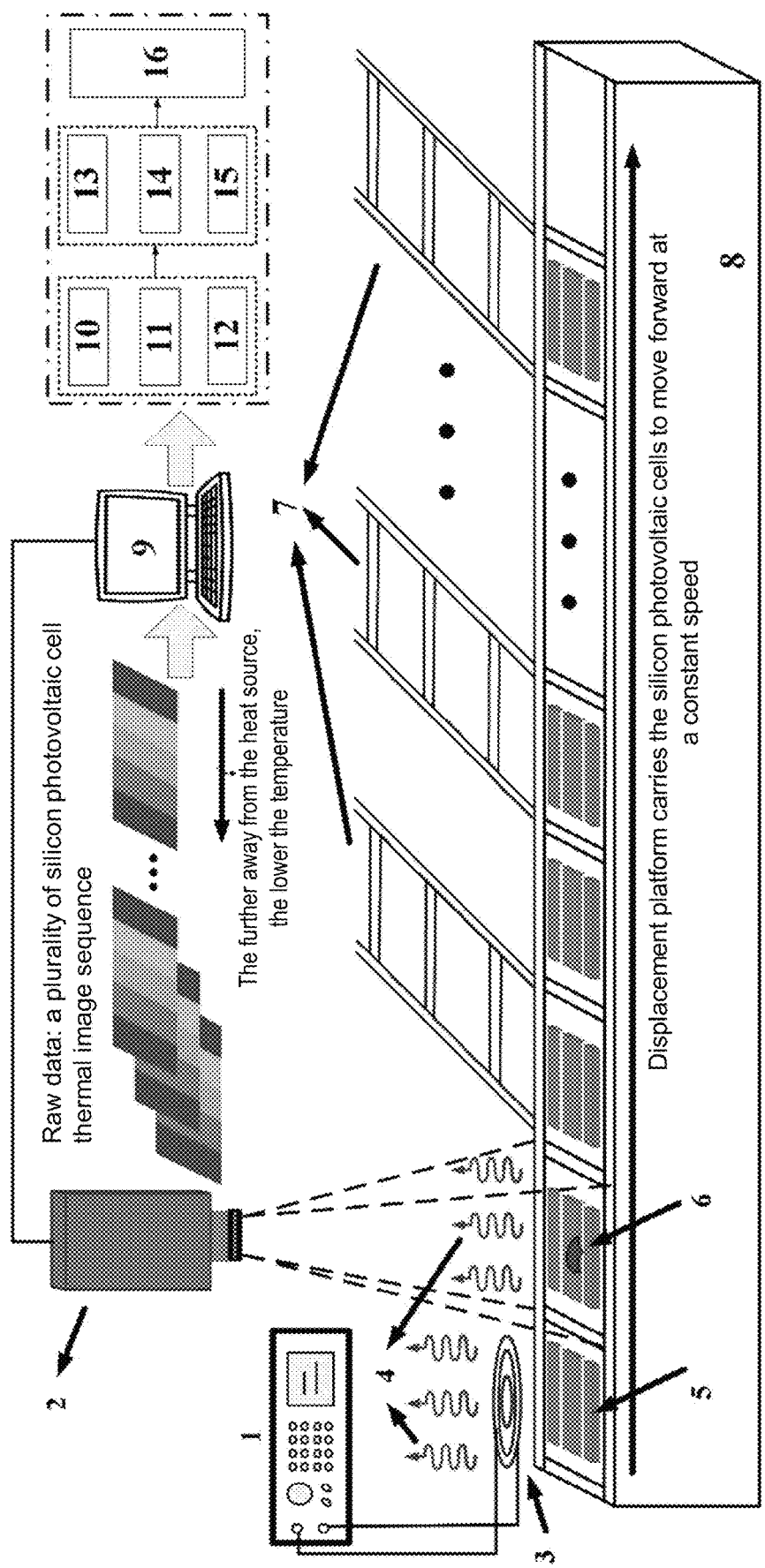
FIG. 1 is a schematic diagram of the structure of the present disclosure.
Figure 2A:
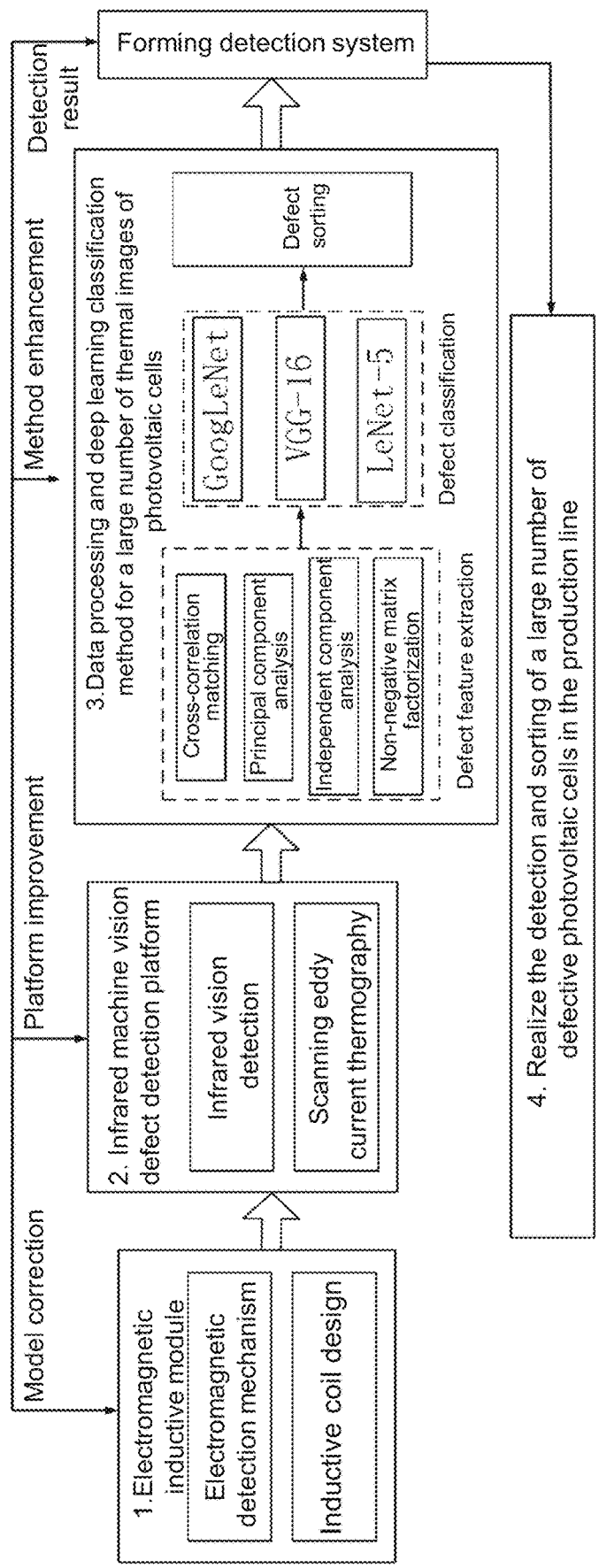
FIG. 2A and FIG. 2B are flow charts of the present disclosure.
Figure 2B:
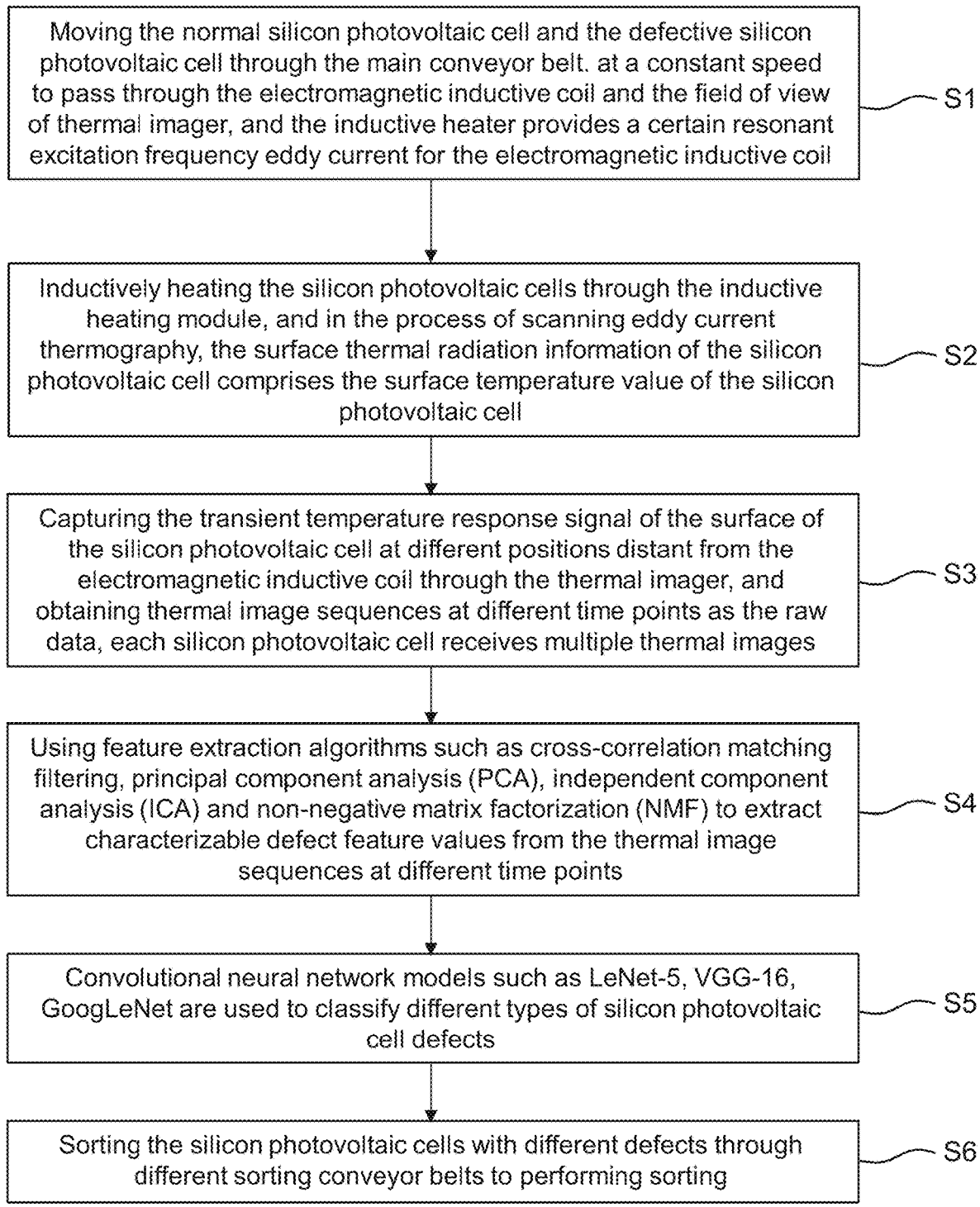

The silicon photovoltaic cell scanning eddy current thermography detection platform at the industrial field production line in the embodiment of the present disclosure is as shown in FIG. 1, including the following.

(1) A main displacement platform module. Since the silicon photovoltaic cell is larger than the electromagnetic inductive coil, and the field of view of the thermal imager is limited, the electromagnetic inductive coil and the thermal imager are kept stationary. The silicon photovoltaic cell is placed on the main conveyor belt to carry the silicon photovoltaic module to move through the displacement platform, and moves forward at a speed of 1 cm/s. The thermal imager real-time acquisition a large number of silicon photovoltaic cell thermal image sequences to achieve defect detection.

(2) A plurality of sorting displacement platforms is connected to the main displacement platform, on which the sorting conveyor belts are placed, and the silicon photovoltaic cells with different defects on the main conveyor belt are sorted through different sorting conveyor belts.

(3) An inductive heating module includes a function signal generator, an inductive heating power supply, an electromagnetic inductive coil and a water-cooling system. The function signal generator controls the heating mode, output power and electromagnetic inductive frequency of the inductive heating power supply. The inductive heating power supply adopts GGC-15A high-power inductive heater, of which the maximum electromagnetic induction power is 15 kW, the input voltage range is 150-240V, and the maximum current is 100 Arms. The electromagnetic inductive frequency range is 100~150 kHz (experiment frequency is f=100 kHz, and the heating power is 300 W in this disclosure), providing resonant electromagnetic inductive frequency for the electromagnetic inductive coil. The electromagnetic inductive coil inductively heats the silicon photovoltaic cell, and the heating mode is divided into two types: a pulse heating mode (stop heating after heating for 1 s) and a lock-in heating mode (heating for 1 s and stops heating for 1 s, cycle several times). The detection effect can be optimized when the coil is disposed at a height of 5 cm above the silicon photovoltaic cell on the main displacement platform. One of the two coils used in the present disclosure is an inner hollow and flat rectangular structure having a diameter of 6.5 cm and a detection area of 73 cm$^2$, and the other one is an inner hollow and elongated structure having a length of 2 cm and a width of 12 cm. A water-cooling system is adopted to introduce water to the inside of the coil to reduce the temperature of the coil, and the cooling water pressure is 0.2~0.3 MPa.

(4) A thermography module. The experiment uses the FLIR A310 thermal imager to capture the surface thermal radiation information of multiple silicon photovoltaic cells in real time. The detection effect can be optimized when the thermography module is disposed at a height of 60 cm above the silicon photovoltaic cell on the main displacement platform. The temperature sensitivity of the thermal imager used in the experiment is 50 mK. The thermal image has a measurement accuracy of ±2°, a detection temperature range of −20° C. to 120° C., and a spectral response range of 7.5 μm to 13 μm.

(5) A computer is connected with the thermal imager, acquiring the raw data captured by the thermal imager in real time and performing thermal sequence analysis, extracting defect features, and classifying different types of silicon photovoltaic cell defects by using convolutional neural network algorithms. The sorting displacement platform is controlled according to a classified result, and the silicon photovoltaic cells with different defects are sorted through different sorting conveyor belts.

In the embodiment of the disclosure, the silicon photovoltaic cell infrared vision defect detection is integrated with feature extraction algorithms and deep learning as well as convolutional neural network image classification method. On basis of the above detection platform, the method includes the following steps.

S1, move the normal silicon photovoltaic cell and the defective silicon photovoltaic cell through the main conveyor belt at a constant speed to pass through the electromagnetic inductive coil and the field of view of thermal imager, and the inductive heater provides a certain resonant electromagnetic inductive frequency for the electromagnetic inductive coil.

S2, inductively heat the silicon photovoltaic cell through the electromagnetic inductive coil. In the process of scanning eddy current thermography, the surface thermal radiation information of the silicon photovoltaic cell includes a surface temperature value of the silicon photovoltaic cell.

S3, capture the transient temperature response signal of the silicon photovoltaic cell at different positions distant from the electromagnetic inductive coil through the thermal imager, and obtain thermal image sequences at different time points as the raw data. Each silicon photovoltaic cell receives multiple thermal images.

S4, use feature extraction algorithms such as frequency domain cross-correlation, PCA, ICA and NMF to extract defect features from the thermal image sequences at different time points.

S5, use convolutional neural networks, such as LeNet-5, VGG-16, GoogLeNet, to classify different types of silicon photovoltaic cell defects.

S6, sort the silicon photovoltaic cells with different defects through different sorting conveyor belts.

In the embodiment of the present disclosure, the step S1 optimizes settings specifically according to the defect attributes of the silicon photovoltaic cell, including the moving speed of the conveyor belt, the field of view of the thermal imager, the parameters of the inductive heating power supply, the parameters of the thermal imager, and the key parameters of the acquisition frequency. The specific method is as follows.

Step 1: set the electromagnetic induction current I of the electromagnetic inductive coil, the displacement speed v of the main conveyor belt, the scanning time $t_s$, the pixel size n×m of the thermal imager, the spatial resolution $d_x$, the lateral field of view $D_n \times D_m$, the sampling frequency $f$, etc. Set the relationship between the spatial distance $d = v \times d_t$ of the adjacent images of the silicon photovoltaic cell recorded by the thermal imager and the spatial resolution $d_x$ of the thermal imager as an integer multiple i, i.e., $d = i \times d_x$. Set the lateral pixel of the thermal imager is an integer multiple of i.

Step 2: use the control module to start the inductive heating power supply, the main conveyor belt and the thermal imager at the same time. In the meantime, the inductive heating power supply drives the inductive coil to heat the silicon photovoltaic cell, wherein the heating width is $d_r$, the heating time of each point of the silicon photovoltaic cell is tr=$d_r$/v, and the heating energy is as shown in the formula (1). Then, the main conveyor belt carries the silicon photovoltaic cell to move forward at a fixed speed v. Specifically, the control module can adopt a function signal generator, and set a periodic or pulsed signal to turn on the power supply of the inductive heater, so that the inductive heating coil heats the silicon photovoltaic cell.

In the embodiment of the present disclosure, the inductively heating process of the silicon photovoltaic cell in step S2 involves three physical processes: 1. electromagnetic inductive heating; 2. heat conduction and heat radiation; 3. thermography.

The scanning eddy current thermography defect detection involves three main physical processes.

Step 1: scanning electromagnetic inductively heat the silicon photovoltaic cell. In the scanning configuration, the inductive heating time tr is finite depending on the heating width $d_r$ and scanning speed v. The heating energy can be expressed as:

$$Q \sim I^2 \times tr \sqrt{\frac{\mu_0 \mu f}{\sigma}} = I^2 \times \frac{d_r}{v} \sqrt{\frac{\mu_0 \mu f}{\sigma}}. \quad (1)$$

In equation (1), I is the electromagnetic induction current in the electromagnetic inductive coil, $f$ is the electromagnetic induction current frequency, $\sigma$ is the conductivity of the silicon photovoltaic cell, $\mu_o$ is the vacuum magnetic permeability and $\mu$ is the magnetic permeability of the silicon photovoltaic cell. The heating width $d_r$ of the eddy current is related to the lift-off h. The larger the lift-off h, the smaller the heating width $d_r$. When electromagnetic heating is actually performed using an inductive coil, the heating efficiency can be expressed as:

$$\eta \approx \frac{1}{1 + \frac{2h}{r}\sqrt{\frac{\sigma \mu_l}{\sigma_l \mu}}}. \quad (2)$$

Step 2: three-dimensional heat conduction process. According to Joule's law, the eddy current induced from the silicon photovoltaic cell will be converted into heat, and the heat conduction in the depth direction is beneficial to the defect detection. The penetration depth can be expressed as:

$$\delta = \frac{1}{\sqrt{\pi \mu \sigma f}}. \quad (3)$$

In equation (3), $f$ is the induction current frequency, the value thereof in the experiment of the present disclosure is 100 kHz. $\sigma$ is the conductivity of the silicon photovoltaic cell, and the value thereof is 2.52×10$^4$ (unit: S/m). $\mu$ is the permeability of the silicon photovoltaic cell, and the value thereof is $4\pi \times 10^{-7}$ (H/m). Through electromagnetic induction at 100 kHz, the penetration depth $\delta$ is calculated to be 3170 μm, which is much larger than the thickness of a silicon photovoltaic cell (about 200 μm). Therefore, the heating method of the silicon photovoltaic cell is volume heating, and the heat is conducted to the inside and the periphery of the material.

Step 3: according to the basic theorem of thermal radiation, when using infrared thermography to record the thermal radiation on the surface of a silicon photovoltaic cell, based on the Stephen-Boltzmann law, that is, the energy radiated per unit time on the surface of the object is proportional to four times the square of the absolute temperature of the object and emissivity:

$$j^* = \sigma_{sb} \varepsilon T^4. \quad (4)$$

In the equation, $\sigma_{sb}$ is the Stefan-Boltzmann constant, T is the absolute temperature (unit: K), and $\varepsilon$ is the emissivity. Finally, the thermal imager records the surface temperature information of the silicon photovoltaic cell changed with time after heating as the raw data and transmits the raw data to the computer.

In the embodiment of the present disclosure, step S4 uses the defect feature extraction method based on feature extraction algorithms such as frequency domain cross-correlation, PCA, ICA, and NMF to extract different types of defect features. The silicon photovoltaic cell defect feature extraction method based on thermal sequence analysis specifically includes the following steps.

Figure 3A:
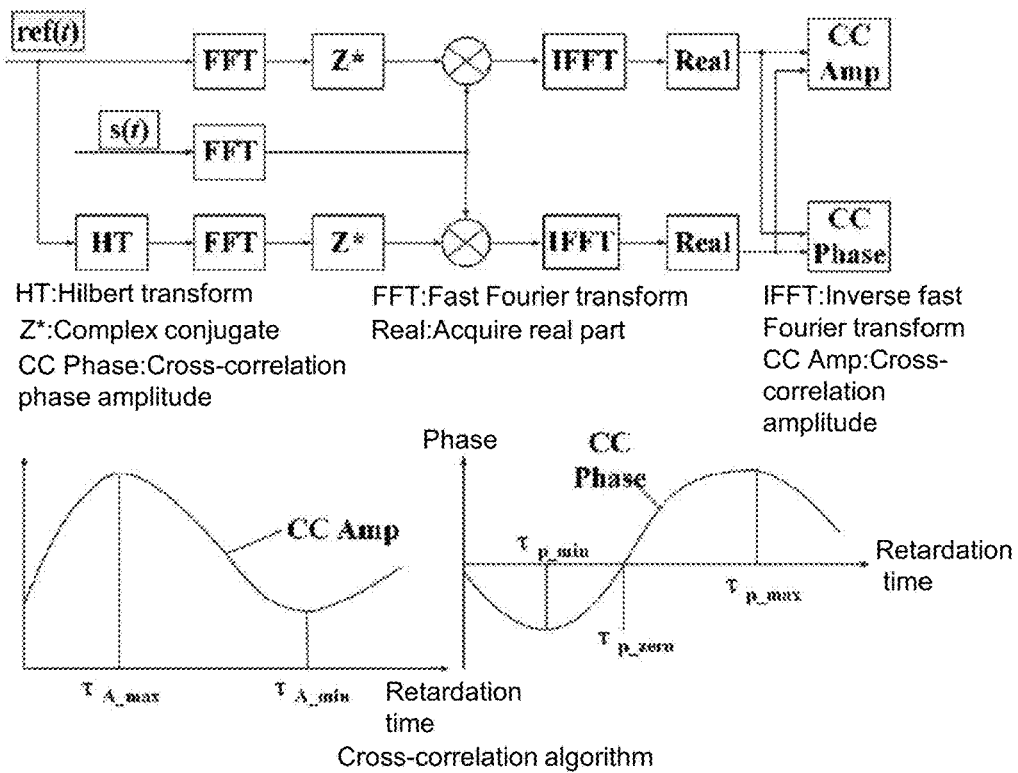
FIG. 3A-FIG. 3D are diagrams showing the principle of frequency domain cross-correlation, principal component analysis (PCA), independent component analysis (ICA), and non-negative matrix factorization (NMF) defect feature extraction algorithms of the method of the present disclosure.

(5.1) Performing defect feature extraction through frequency domain cross-correlation algorithm, as shown in FIG. 3A.

Step 1: use the detection signal of the defect-free area of the silicon photovoltaic cell as the reference signal ref(t). In order to improve the signal-to-noise ratio, the average detection signal at a certain number of points in the defect-free area of the detection data can also be used as a reference signal.

Step 2: calculate the in-phase and quadrature signals of the detected signal s(t) and the reference signal ref(t) in the detection data through a frequency domain cross-correlation algorithm. The detection signal s(t) refers to the original signal (the thermal image sequences continuously collected by the thermal imager).

Step 3: as shown in FIG. 3A, the detection signal is subjected to fast Fourier transform (FFT) to obtain a frequency domain detection signal. The reference signal is subjected to Hilbert transform (HT) to generate an orthogonal reference signal. The reference signal and the orthogonal reference signal are subjected to the fast Fourier transform (FFT) and the complex conjugate (Z*) operation to obtain a frequency domain reference signal and a frequency domain orthogonal reference signal. The frequency domain detection signal and the frequency domain reference signal are sequentially subjected to multiplication, inverse fast Fourier transform (IFFT) operation, and real arithmetic (Real) operation to obtain an in-phase signal.

Step 4: sequentially subject the frequency domain detection signal and the frequency domain orthogonal reference signal to multiplication, inverse fast Fourier transform (IFFT) operation and real part operation (Real) operation to obtain a quadrature signal.

Figure 3B:
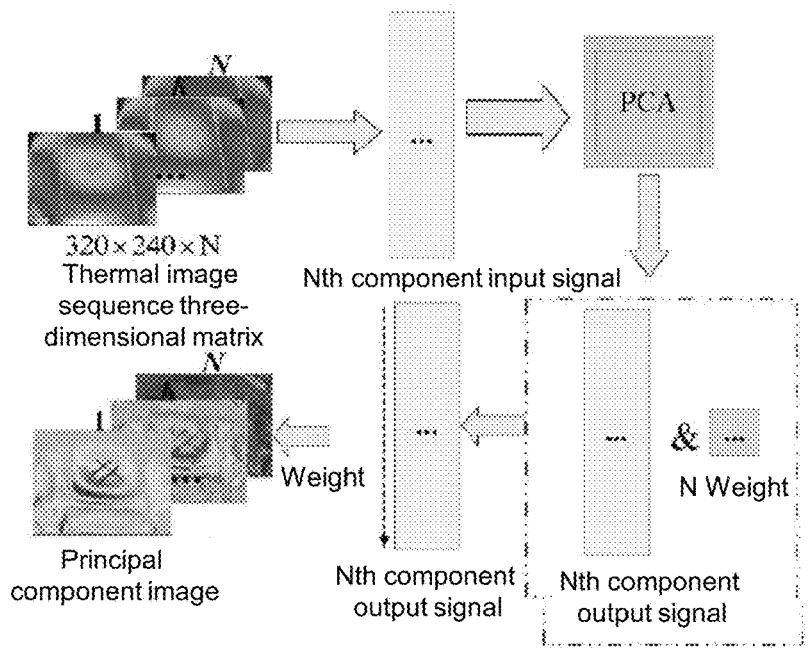

Step 5: obtain the cross-correlation amplitude (CC Amp) image after obtaining the amplitude of the in-phase and quadrature signals, as shown in FIG. 3B. Obtain a cross-correlation phase (CC Phase) image after phasing the quadrature and the in-phase.

Figure 3C:
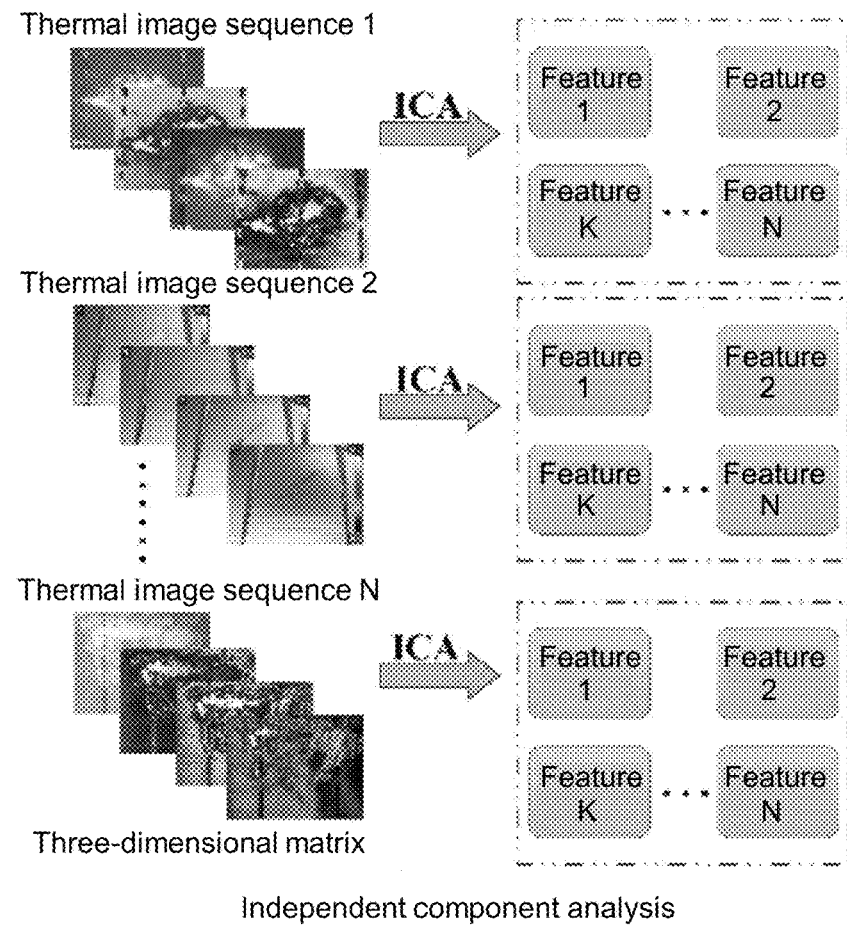
Figure 3D:
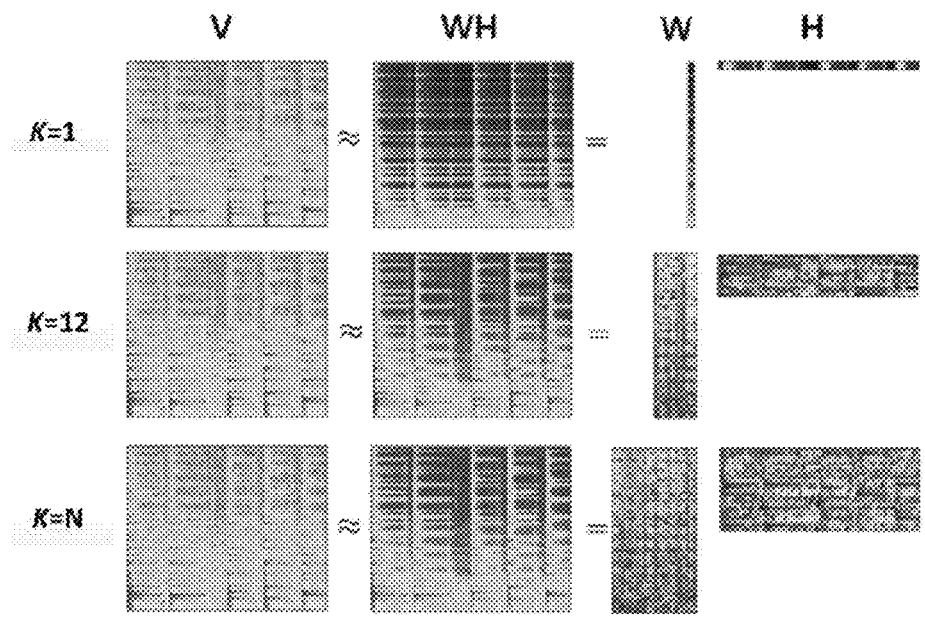

(5.2) Perform defect feature extraction on PCA, ICA, and NMF algorithms, as shown in FIG. 3B-FIG. 3D.

Step 1: import the original thermal sequence of the silicon photovoltaic cell obtained by using the thermal imager into MATLAB, which is a 3D array data.

Step 2: convert the 3D array into a 2D array in MATLAB. Each row vector of the 2D array represents the temperature sequence of each pixel in the thermal image, which can be interpreted as the transient temperature response.

Step 3: process the thermal image sequences by using PCA, ICA, and NMF to obtain the corresponding principal component (PCs), independent component (ICs), and NMF components. Each PCs and ICs are a one-dimensional vector. Convert one-dimensional vectors into two-dimensional arrays in MATLAB through data conversion.

Step 4: select the appropriate PCs, ICs and NMF components for image reconstruction to obtain a clear two-dimensional image of the defective silicon photovoltaic cell.

Figure 4:
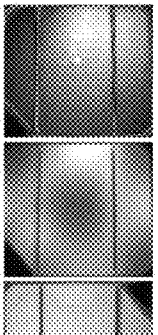
FIG. 4 are thermal images of silicon photovoltaic cell and defect feature extraction measurement data obtained through the method of the present disclosure.

The thermal image of the silicon photovoltaic cell and measured data extracted from defect features obtained by the experiment of the present disclosure are shown in FIG. 4. The data listed in the figure is divided into six defect types, and each defect has 120 original thermal images. There are total of 720 original thermal images with defects. The original thermal image pixel produced by the thermal imager is 320×240 pixels. In the meantime, FIG. 4 lists multiple defect feature extraction images obtained by using PCA, ICA and NMF algorithms.

In the embodiment of the present disclosure, in step S5, convolutional neural networks such as LeNet-5, VGG-16, GoogLeNet are used to classify different types of silicon photovoltaic cell defects, specifically including the following steps:

Step 1: in the experiment, the CPU is Inter (R) Core (TM) i7-4790 CPU @ 3.60 GHz, the GPU is NVIDIA GeForce GTX 750 Ti. The convolutional neural network framework is open source frameworks which are GoogLeNet, VGG-16 and LeNet-5 frameworks in Caffe. The original thermal images produced by the FLIR A310 thermal imager have 320×240 pixels. Each original thermal image is pre-processed by image registration and the size of all thermal images is changed into 224×224 pixels.

Figure 5:
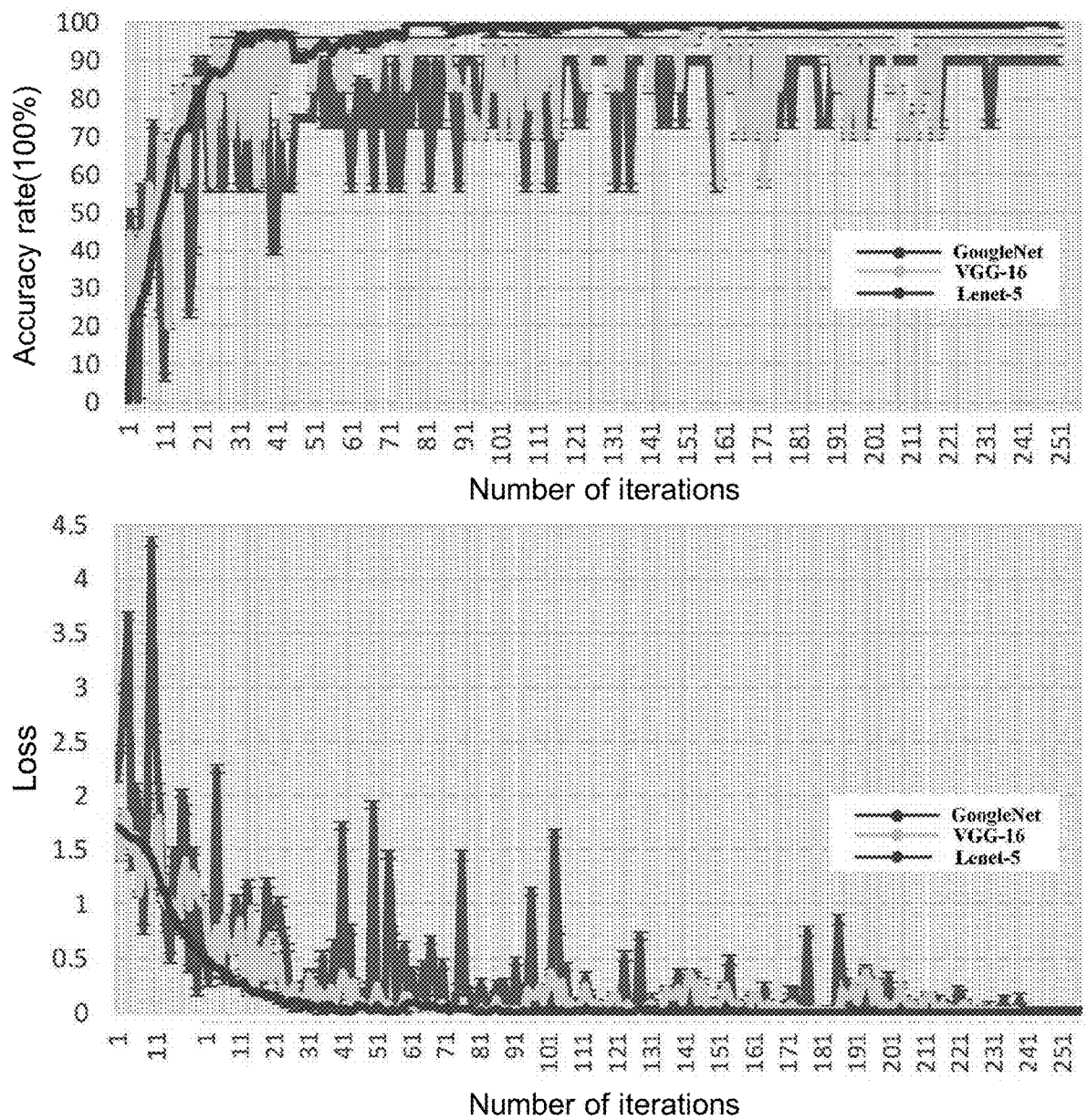
FIG. 5 is a defect classification training result obtained through convolutional neural networks such as LeNet-5, VGG-16, GoogLeNet, etc. according to the method of the present disclosure.

Step 2: the FLIR A310 thermal imager obtains 720 original thermal images with defects and extracts 720 images from PCA, ICA and NMF respectively. There is a total of 2880 thermal images. These defective silicon photovoltaic cell data are imported into LeNet-5, VGG-16 and GoogLeNet convolutional neural networks for defect classification and identification. 80% of the data is used as the train data set and 20% of the data is used as the test data set. Therefore, the number of training data sets is 2304 and the number of test data sets is 576. After establishing the data, we fine-tune the data obtained by using the LeNet-5, VGG-16, and GoogLeNet models. The training results in FIG. 5 show that all three classification algorithms achieved high accuracy values. The GoogLeNet model has the best classification accuracy and loss function. At the $30^{th}$ repeated operation, the GoogLeNet model shows more than 90% accuracy. The GoogleNet model achieves the maximum 100% classification accuracy in the $77^{th}$ repeated operation during training, and the corresponding loss function value is 0.002. From the $77^{th}$ repeated operation and onwards, the GoogLeNet model basically maintains 100% classification accuracy. In the $21^{st}$ repeated operation in the training, the VGG-16 model achieves the maximum accuracy value, the final classification accuracy rate is fixed at 94.67%. The LeNet-5 model has the highest accuracy rate of 89.65%. Therefore, it can be proved that GoogLeNet has the best defect classification effect.

Figure 6:
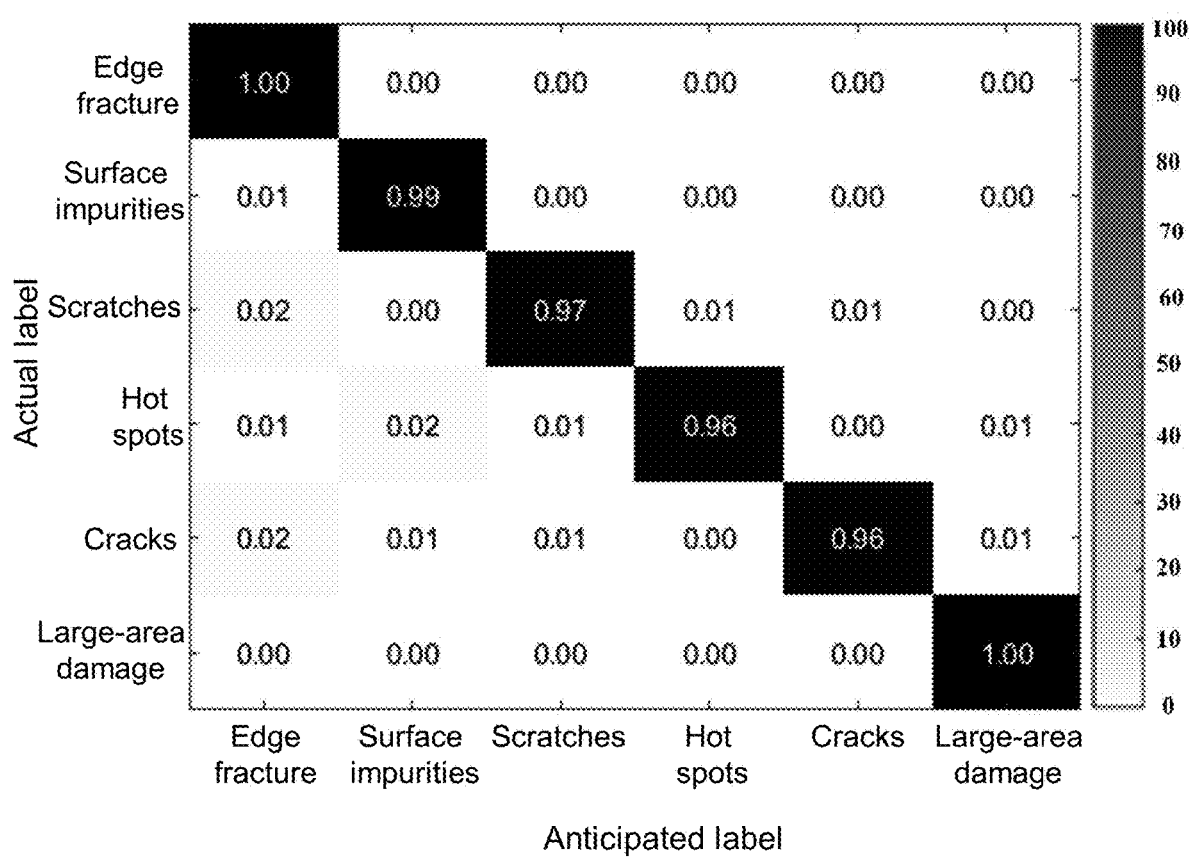
FIG. 6 is a classification accuracy rate and an error rate of six defects such as edge fracture, surface impurities, scratches, cracks, hot spots and large-area damage according to the present disclosure.

Step 3: apply the Relu activation function to all convolutional layers in GoogLeNet. The number of neurons in the fully connected layer can be modified because there were six types of silicon photovoltaic cell defects in the experiment, so the number of neurons in the final fully connected layer was modified to six. In order to prevent over-fitting, reduce errors, enhance features, and speed up the convergence, after performing the convolution operation on the model, the improved linear unit (Relu) is used as the classifier. This disclosure not only improves the efficiency of computer resources (specifically in processing a large number of silicon photovoltaic cell data sets), but also improves the accuracy of defect classification tasks. By selecting 720 images after defect feature extraction, 120 images for each type of defect, FIG. 6 shows the accuracy and error rate of the six types silicon photovoltaic cell defects classification. The classification accuracy and error of edge crushing, surface impurities, scratches, cracks, hot spots and large-area damage respectively achieves 100% (120/120, 0 error), 99.16% (119/120, 1 error), 96.67% (116/120, 4 errors), 95.83% (115/120, 5 errors), 95.83% (115/120, 5 errors), 100% (120/120, 0 error). The classification accuracy of various silicon photovoltaic cell defects is improved to some extent as compared with the condition where the defect feature extraction is not performed.

On this basis, eddy current scanning thermography and convolutional neural network technology have high application potential in the detection and automatic identification of silicon photovoltaic cell defects, which can realize the detection and defect sorting of a large number of silicon photovoltaic cells in industrial production lines, and provide a reliable method for the development, testing, manufacturing, service and maintenance of silicon photovoltaic cells.

The disclosure mainly utilizes a main conveyor belt to carry a silicon photovoltaic cell to move forward on a production line to form a scanning eddy current heating of a silicon photovoltaic cell. The defect temperature information is obtained by using the thermal imager in a non-contact, fast, high-resolution manner. By using the feature extraction algorithms such as frequency domain cross-correlation, PCA, ICA and NMF, it is possible to extract defect features from thermal image sequences at different time points. Finally, the convolutional neural networks such as LeNet-5, VGG-16 and GoogLeNet are used to classify different types of silicon photovoltaic cell defects and use the sorting conveyor belts to realize automatic sorting of different defective silicon photovoltaic cells on the production line. The disclosure greatly improves the efficiency and performance of the online detection, and the detection process is subjectively and objectively integrated, and the classification result is accurate.

In addition, the research results of the present disclosure can also be applied to the quality detection in production of metal or carbon fiber reinforced plastic as well as the on-line detection of large components such as traffic tracks and wind turbine blades.

According to the silicon photovoltaic cell infrared vision defect detection software system in the embodiment of the disclosure, the software system integrates defect detection classification and sorting module, including the following.

A reference signal setting module is configured to set the reference signal, use the detection signal of the defect-free area of the silicon photovoltaic cell as the reference signal, or use the average detection signal at certain points in the defect-free area in the detection data as a reference signal.

A detection signal extraction module is configured to use a transient temperature change sequence at a different position of the silicon photovoltaic cell captured in real time with the thermal imager as a detection signal, and use feature extraction algorithms to extract defect features from the detection signal.

A defect classification module is configured to classify different types of silicon photovoltaic cell defects by using convolutional neural network.

A defect sorting module is configured to control the sorting and recycling of silicon photovoltaic cells with different defect types. The specific implementation of each module is described in details in the above embodiment, and will not be described again.

It should be understood that modification or change can be made by those skilled in the art according to the above description, and all such modifications and changes are regarded as falling within the scope of the appended claims of the disclosure.

What is claimed is:

1. A silicon photovoltaic cell scanning eddy current thermography detection platform, comprising:
   a main displacement platform on which a main conveyor belt is disposed, wherein a silicon photovoltaic cell is placed on the main conveyor belt;
   a thermal imager configured to collect thermal image sequences of the silicon photovoltaic cell in real time;
   a plurality of sorting displacement platforms connected to the main displacement platform, wherein sorting conveyor belts are placed thereon, and the silicon photovoltaic cells with different defects on the main conveyor belt are sorted and sent to different sorting conveyor belts;
   an inductive heating module configured to inductively heat the silicon photovoltaic cells through electromagnetic induction;
   a thermal imager disposed above the silicon photovoltaic cell of the main displacement platform to capture surface thermal radiation information of the plurality of silicon photovoltaic cells in real time;
   a computer connected with a thermal imager to obtain raw data captured by the thermal imager in real time and perform thermal sequence analysis, extract defect features, and use convolutional neural network algorithms to classify different types of silicon photovoltaic cell defects; wherein a sorting displacement platform is controlled according to a classified result, and the silicon photovoltaic cells with different defects are sorted through different sorting conveyor belts,
   wherein the inductive heating module comprises a function signal generator, an inductive heating power supply, an electromagnetic inductive coil and a water-cooling system, and the function signal generator controls a heating mode, an output power and an electromagnetic inductive frequency of the inductive heating power supply; the electromagnetic inductive coil is arranged above the silicon photovoltaic cell on the main displacement platform,
   wherein the water-cooling system introduces water into an inside of the electromagnetic inductive coil to reduce a temperature of the electromagnetic inductive coil, and a cooling water pressure is 0.2 to 0.3 MPA.

2. The silicon photovoltaic cell scanning eddy current thermography detection platform according to claim 1, wherein that the electromagnetic inductive coil is disposed at a height of 5 cm above the silicon photovoltaic cells on the main displacement platform; the electromagnetic inductive coil is an inner hollow flat rectangular structure and an elongated structure.

3. The silicon photovoltaic cell scanning eddy current thermography detection platform according to claim 1, wherein the thermal imager is disposed at a height of 60 cm above the silicon photovoltaic cells on the main displacement platform;
a measurement accuracy of the thermal imager is +2°, a detection temperature range is −20° C. to 120° C., and a spectral response range is 7.5 μm to 13 μm.

4. The silicon photovoltaic cell scanning eddy current thermography detection platform according to claim 1, wherein a temperature sensitivity of the thermal imager is 50 mK.

5. The silicon photovoltaic cell scanning eddy current thermography detection platform according to claim 1, wherein the heating mode of the inductive heating module comprises a pulse heating mode and a lock-in heating mode.

6. A silicon photovoltaic cell infrared vision defect detecting method, the method being based on the detection platform of claim 1, comprising the steps of:
   S1, carrying a normal silicon photovoltaic cell and a defective silicon photovoltaic cell through a main conveyor belt at a constant speed to pass the inductive heating module and a field of view of a thermal imager;
   S2, inductively heating the silicon photovoltaic cells through the inductive heating module, and in the process of scanning eddy current thermography, the surface thermal radiation information of the silicon photovoltaic cell comprises a surface temperature value of the silicon photovoltaic cell;
   S3, obtaining a transient temperature response of the silicon photovoltaic cells at different positions through the thermal imager and obtaining thermal image sequences at different time points as raw data, and each of the silicon photovoltaic cell receives multiple thermal image sequences;
   S4, using frequency domain cross-correlation, principal component analysis (PCA), independent component analysis (ICA) or non-negative matrix factorization (NMF) feature extraction algorithms to extract defect features from the thermal image sequences at different time points;
   S5. using convolutional neural networks to classify different types of silicon photovoltaic cell defects; wherein the classified defects comprise edge fracture, surface impurities, scratches, cracks, hot spots and large-area damage;
   S6. sorting the silicon photovoltaic cells with different defects through different sorting conveyor belts.

7. The method according to claim 6, wherein the step S1 further comprises optimizing the setting according to the defect attributes of the silicon photovoltaic cells, comprising setting a moving speed of the main conveyor belt, a size of the field of view of the thermal imager, parameters of the inductive heating module, parameters of the thermal imager, and data acquisition frequency.

8. A silicon photovoltaic cell infrared vision defect detection software system according to claim 1, wherein the software system integrates defect detection classification and a sorting module, comprising:
   a reference signal setting module configured to set a reference signal, use a detection signal of the defect-free area of the silicon photovoltaic cells as the reference signal, or use an average detection signal at certain points in the defect-free area in the detection data as the reference signal;
   a detection signal extraction module is configured to use a transient temperature change sequence at a different position from the electromagnetic inductive coil of the silicon photovoltaic cell captured by the thermal imager in real time as a detection signal and use feature extraction algorithms to extract the defect features from the detection signal;

a defect classification module configured to classify different types of silicon photovoltaic cell defects by using convolutional neural networks;

a defect sorting module configured to control the sorting conveyor belts to sort and recycle the silicon photovoltaic cells with different defects.

\* \* \* \* \*